(12) United States Patent
Choserot et al.

(10) Patent No.: US 8,897,054 B2
(45) Date of Patent: Nov. 25, 2014

(54) ROM DEVICE WITH KEEPERS

(71) Applicant: Intel Mobile Communications GmbH, Neubiberg (DE)

(72) Inventors: Vianney Choserot, Antibes (FR); Marie Lafont Marazel, Pegomas (FR)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/769,438

(22) Filed: Feb. 18, 2013

(65) Prior Publication Data
US 2014/0233295 A1 Aug. 21, 2014

(51) Int. Cl.
| | | |
|---|---|---|
| *G11C 17/00* | (2006.01) | |
| *G11C 7/22* | (2006.01) | |
| *G11C 7/12* | (2006.01) | |
| *G11C 17/18* | (2006.01) | |
| G11C 11/413 | (2006.01) | |
| G11C 7/10 | (2006.01) | |

(52) U.S. Cl.
CPC ............. *G11C 17/18* (2013.01); *G11C 11/413* (2013.01); *G11C 7/22* (2013.01); *G11C 7/1075* (2013.01); *G11C 7/12* (2013.01)
USPC .......................... 365/94; 365/189.05; 365/203

(58) Field of Classification Search
CPC .......... G11C 7/12; G11C 7/22; G11C 7/1075; G11C 11/413
USPC ............ 365/94, 194, 189.02, 189.05, 189.14, 365/189.15, 189.06, 189.11, 203, 230.02, 365/227
See application file for complete search history.

(56) References Cited

U.S. PATENT DOCUMENTS

| | | | | |
|---|---|---|---|---|
| 7,209,394 | B1 * | 4/2007 | Dankert et al. | 365/189.02 |
| 7,668,035 | B2 * | 2/2010 | Chu et al. | 365/227 |
| 7,764,547 | B2 * | 7/2010 | Lee et al. | 365/185.17 |
| 7,952,941 | B2 * | 5/2011 | Wijeratne et al. | 365/189.11 |
| 8,125,842 | B2 * | 2/2012 | Dudeck et al. | 365/194 |
| 8,134,874 | B2 * | 3/2012 | Shiu et al. | 365/189.06 |

OTHER PUBLICATIONS

Singh et al., "Bitline Techniques With Dual Dynamic Nodes for Low-Power Register Files"; IEEE Transactions on circuits and systems-I: Regular Papers, vol. 60, No. 4, Apr. 2013, pp. 965-974.

* cited by examiner

*Primary Examiner* — Gene Auduong (57) ABSTRACT

A ROM memory circuit is disclosed having at least one electrical line, at least one keeper circuit electrically connected to the at least one electrical line, the keeper circuit including a first transistor, a terminal of the first transistor is driven by a dedicated control signal, wherein the dedicated control signal is configured to keep the voltage of the at least one electrical line at a first voltage.

25 Claims, 9 Drawing Sheets

ROM DEVICE WITH KEEPERS

TECHNICAL FIELD

The disclosure relates to a ROM (read-only memory) circuit device, and more particularly to a ROM circuit which includes at least one keeper transistor controlled by a dedicated control signal.

BACKGROUND

Figure 1:
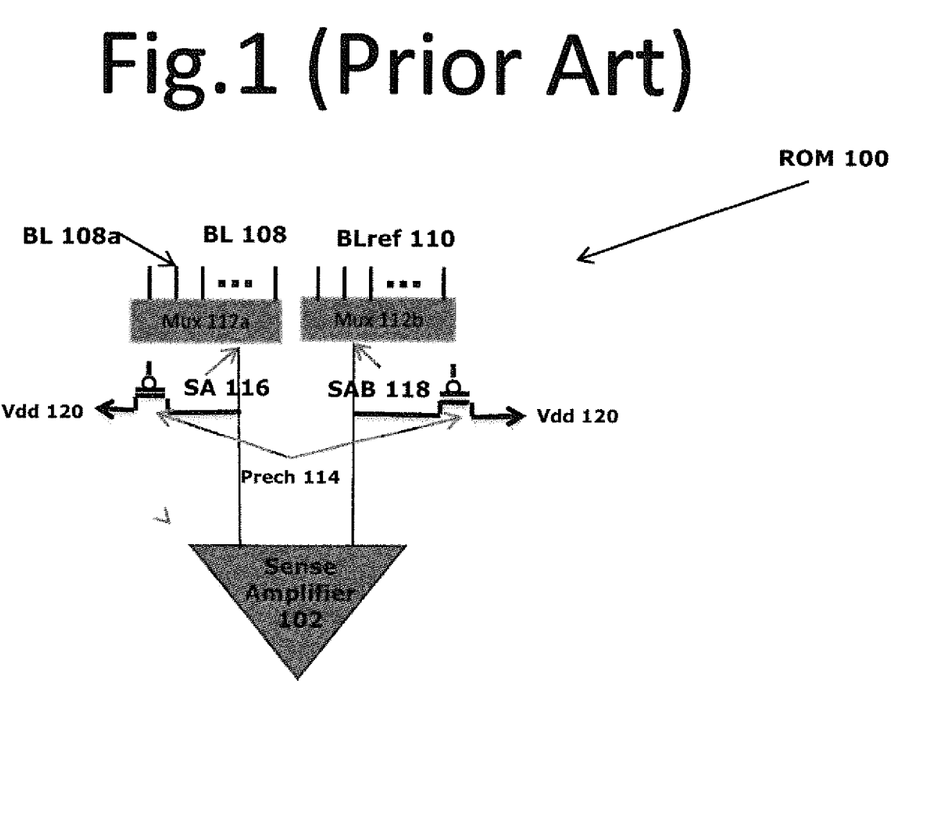
FIG. 1 is an electrical schematic illustrating the architecture of a conventional ROM circuit.

ROM memory circuits are widely used in electronic devices. FIG. 1 is an electrical schematic of a conventional ROM circuit 100. It includes sense amplifier 102, precharge transistors 114, multiplexers (MUX) 112a and 112b, sense terminals SA 116 and SAB 118, a plurality of bit lines 108, and one or more reference bit lines 110.

Each of bit lines 108 is electrically connected to one or a plurality of memory cells (not shown in FIG. 1) of ROM circuit 100. Each MUX 112a or 112b includes a plurality of transistors (not shown in FIG. 1). Each transistor in MUX 112a is electrically connected to one of bit lines 108, and each transistor in MUX 112b is electrically connected to one of reference bit lines 110. Sense amplifier 102 includes a sense terminal SA 116 and an optional sense terminal SAB 118. Each of precharge transistors 114 is electrically connected to one of sense terminals SA 116 and SAB 118 and to $V_{dd}$ 120 (power supply voltage).

Precharge transistors 114 are configured to precharge sense terminals SA 116 and SAB 118 to $V_{dd}$ prior to an operation of reading digital data from the memory cells of ROM circuit 100. Each transistor in MUX is electrically connected to one of bit lines 108 or one of reference bit lines 110 in a manner that provides for MUX 112a or 112b to select each of bit lines 108 or reference bit lines 110 as input to MUX 112a or 112b. Particularly, MUX 112a selects one bit line from a plurality of bit lines 108 as input to sense amplifier 102 through sense terminal SA 116 and MUX 112b selects one reference bit line from a plurality of reference bit lines 110 as input to sense amplifier 102 through sense terminal SAB 118. Sense amplifier 102 is configured to sense the electrical state (e.g., the voltage state) of sense terminals SA 116 and SAB 118.

Typically, during the operation of conventional ROM circuits, such as ROM circuit 100 illustrated in FIG. 1, all sense terminals, more particularly, sense terminals SA 116 and SAB 118 as shown in FIG. 1, are precharged to $V_{dd}$ 120 by precharge transistors 114 to a READ operation. If the digital data to be read from a bit line (e.g. bit line 108a as shown in FIG. 1) selected by MUX 112a is a digital 0, then bit line 108a will have been discharged to ground (i.e., a digital 0 or a "low" state) through a memory cell subsequent to its having been precharged. On the other hand, if the digital data to be read from bit line 108a selected by MUX 112a is a digital 1, then bit line 108a will be in a high impedance state (i.e., a digital 1 or a "high" state). The discharged to ground or high impedance state of bit line 108a is sensed and amplified by sense amplifier 102. However, during read operations, bit line 108a is always over-discharged because of the leakage of memory cells. Tuning between read 1 signal and read 0 signal is dependent on the discharging level of bit line 108a. In order to have a correct swing value for sensing, bit line 108a has to be discharged to an intermediate voltage. The intermediate voltage, however, may be lower than the threshold value of the transistors in MUX. This limits the signal developed on sense terminal SA 116. The performance of ROM 100 is therefore slowed down by this limiting factor.

Figure 2A:
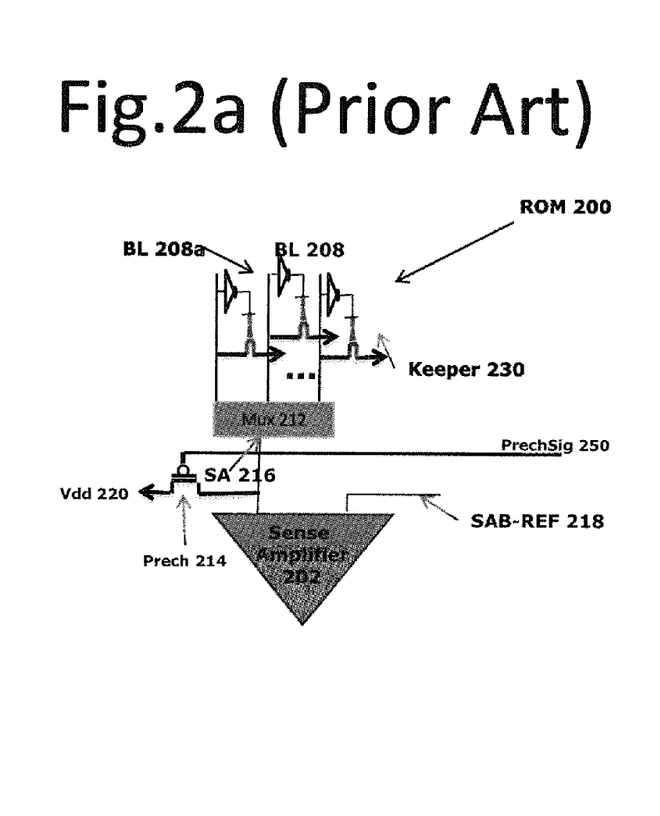
FIG. 2a is an electrical schematic illustrating the architecture of a conventional ROM circuit with feedback keepers.

In order to counter leakage, keepers may be used. As shown in FIG. 2a, ROM circuit 200 includes sense amplifier 202, precharge transistor 214, multiplexer (MUX) 212, sense terminals SA 216 and SAB-Ref 218, bit lines 208. Further, each bit line of bit lines 208 connects to a keeper 230.

Each bit line of bit lines 208 is electrically connected to one or a plurality of memory cells (not shown in FIG. 2a) of ROM circuit 200. MUX 212 includes a plurality of transistors (not shown in FIG. 2). Each transistor in MUX 212 is electrically connected to one of bit lines 208. Sense amplifier 202 includes a sense terminal SA 216 and an optional sense terminal SAB-Ref 218. Precharge transistor 214 is electrically connected to sense terminal SA 216 and to $V_{dd}$ 220 (power supply voltage).

Precharge transistor 214 is configured to precharge sense terminal SA 216 to $V_{dd}$ according to a control signal PrechSig 250. Each transistor in MUX 212 is electrically connected to one of bit lines 208 in a manner that provides for MUX 212 to select each of bit lines 208 as input to MUX 212. For example, MUX 212 selects one bit line 208a from a plurality of bit lines 208 as input to sense amplifier 202 through SA 216. Sense amplifier 202 is configured to sense the electrical state (e.g., the voltage state) of sense terminal SA 216.

Figure 2B:
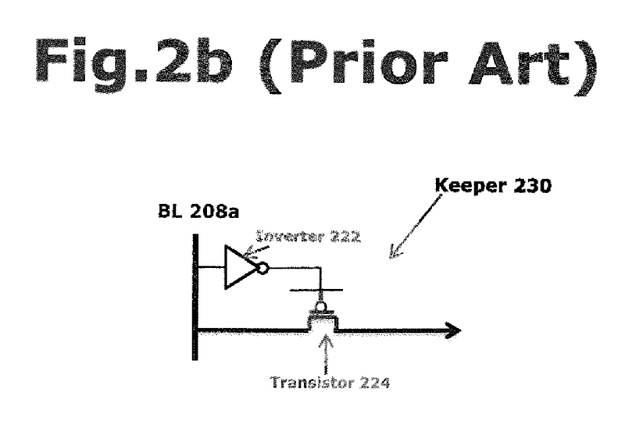

Further, each bit line of bit lines 208 connects to a keeper. One exemplary keeper 230 is shown in detail in FIG. 2b. Typically, keeper 230 is a conventional feedback keeper using an inverter 222 and a keeper transistor 224 to hold the output high. Source terminal of keeper transistor 224 and input of inverter 222 are coupled to a bit line (for example, bit line 208a), and gate of keeper transistor 224 is driven by the output of inverter 222. In other words, keeper 230 is controlled by bit line inverted command to keep voltage of bit line 208a higher than the voltage threshold of inverter 222. During read operation, bit line 208a is less discharged due to the implementation of keepers 230. However, as the voltage of bit line 208a decreases to the threshold voltage $V_{th}$ of keeper transistor 224, keeper 230 is turned off. As keeper 230 is turned off, the voltage of bit line 208a begins to drop dramatically, and the sensing windows may be unstable.

Figure 2C:
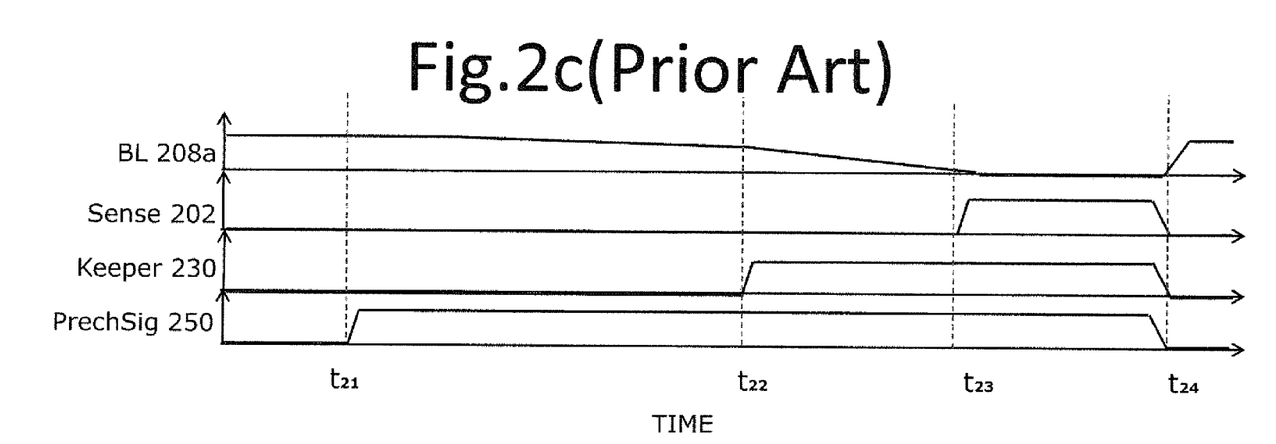
FIG. 2c is a timing diagram showing signals in the ROM circuit with a conventional feedback keeper.

Referring to FIG. 2c, reading operation of ROM circuit 200 will be described. First, at time $t_{21}$, precharge signal 250 is switched from Low to High, and a precharge period is terminated. The voltage in precharged bit line 208a begins discharging rapidly due to leakage. Keeper 230 is in active status to stabilize (or keep) the voltage in bit line 208a against leakage. At time $t_{22}$, the voltage of bit line 208a drops to the threshold voltage value $V_{th}$ of keeper transistor 224. Keeper 230 is switched off as a result. As keeper 230 is off, the voltage of bit line BL begins to drop dramatically due to leakage in the absence of keeper 230. Next, at time $t_{23}$, when the voltage of BL almost drops to ground, sense amplifier is switched on, and moves to a sense period. Next, at time $t_{24}$, after sensing, precharge signal 250 is switched from High to Low, so that bit line 208a is again charged to power supply potential $V_{dd}$.

The drop in voltage on bit line 208a in time period between $t_{22}$ and $t_{23}$ leads to several disadvantages including an unstable sensing window. A feedback-controlled keeper only partly resolves this problem, while introducing others, potentially complicating sensing.

Therefore, a keeper circuit that reliably stabilizes voltage in a memory without interfering with sensing process will be desirable. Also, it would be preferable for such a keeper circuit to occupy less space in the ROM circuit.

BRIEF SUMMARY

According to an aspect of the present disclosure, a ROM memory circuit is disclosed having: at least one electrical line; at least one keeper circuit electrically connected to the at least one electrical line, the keeper circuit including a keeper transistor, a terminal of which is driven by a dedicated control signal, wherein the dedicated control signal is configured to keep the voltage of the at least one electrical line at a first voltage.

According to a further aspect of the present disclosure, the terminal of the keeper transistor is a gate of the transistor. The semiconductor memory circuit may further comprise a sense amplifier having at least one input line, wherein the dedicated control signal is further configured to control the keeper transistor to be active until the sense amplifier performs a sense operation, and wherein the at least one electrical line is configured as the at least one input line.

According to a further aspect of the present disclosure, the semiconductor memory circuit may further comprise a controller, the controller configured to generate the control signal based on the timing of said sense operation.

According to a further aspect of the present disclosure, the semiconductor memory circuit may further comprise at least one multiplexer configured to select at least one of a plurality of bit lines as an input to the at least one multiplexer, at least one of the bit lines being said at least one electrical line, wherein said multiplexer includes a plurality of pMOS transistors, the multiplexer transistors having a voltage threshold, the first voltage being higher than the voltage threshold of the multiplexer transistors, and wherein the keeper circuit does not include an inverter connected to the electrical line.

According to a further aspect of the present disclosure, the keeper transistor has a voltage threshold, the first voltage being less than the voltage threshold of the keeper transistor.

According to a further aspect of the present disclosure, the semiconductor memory circuit may further comprise a sense amplifier having at least one input line coupled to an output node of the at least one multiplexer and at least one precharge transistor coupled to the at least one input line.

According to a further aspect of the present disclosure, the memory circuit is a Read-Only Memory (ROM).

According to an aspect of the present disclosure, a method for stabilizing voltage on a target line in a memory circuit is disclosed. The method includes: connecting the target line to a source having a first voltage via a transistor having a gate, the gate having a threshold voltage; charging the target line to a second voltage; selectively generating a dedicated signal exceeding said threshold voltage; and applying the signal to said gate to operate said transistor in accordance with the signal, wherein the voltage on the target line is maintained at said first voltage via connection to said source while said signal is applied.

According to a further aspect of the present disclosure, the method further includes discontinuing the application of the signal and performing a sense operation on said target line, wherein said signal is generated by a controller, and wherein said controller generates said signal based on a timing of said sense operation.

According to a further aspect of the present disclosure, said first voltage is below said threshold voltage, and said target line is connected to an input of a multiplexer, and said target line is connected to an output of a multiplexer.

According to an aspect of the present disclosure, a ROM memory circuit is disclosed having: at least one electrical line; and at least one keeper circuit electrically connected to the at least one electrical line, the keeper circuit including a first transistor having a gate, the gate being not electrically connected to the at least one electrical line, and the gate being controlled to keep the voltage of the at least one electrical line at a first voltage.

According to a further aspect of the present disclosure, the gate of the first transistor has a threshold voltage, and the first voltage is below the threshold voltage.

According to a further aspect of the present disclosure, the ROM circuit further including: a sense amplifier having at least one input line being the at least one electrical line, wherein the gate of the first transistor is controlled based on the timing of a sense operation of the sense amplifier.

According to a further aspect of the present disclosure, the ROM circuit further including: at least one multiplexer configured to select at least one of a plurality of bit lines as an input to the at least one multiplexer, at least one of the bit lines being said at least one electrical line.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. In the following description, various approaches are described with reference to the following drawings, in which:

FIG. 2b is an electrical schematic illustrating the architecture of a conventional feedback keeper of FIG. 2a.

DETAILED DESCRIPTION

In the following detailed description, reference is made to the accompanying drawings, which form a part hereof, and in which is shown by way of illustration specific approaches in which the disclosure may be practiced. It is to be understood that other approaches may be utilized and structural or logical changes may be made without departing from the scope of the present disclosure. The following detailed description, therefore, is not to be taken in a limiting sense, and the scope of the present disclosure is defined by the appended claims.

Figure 3:
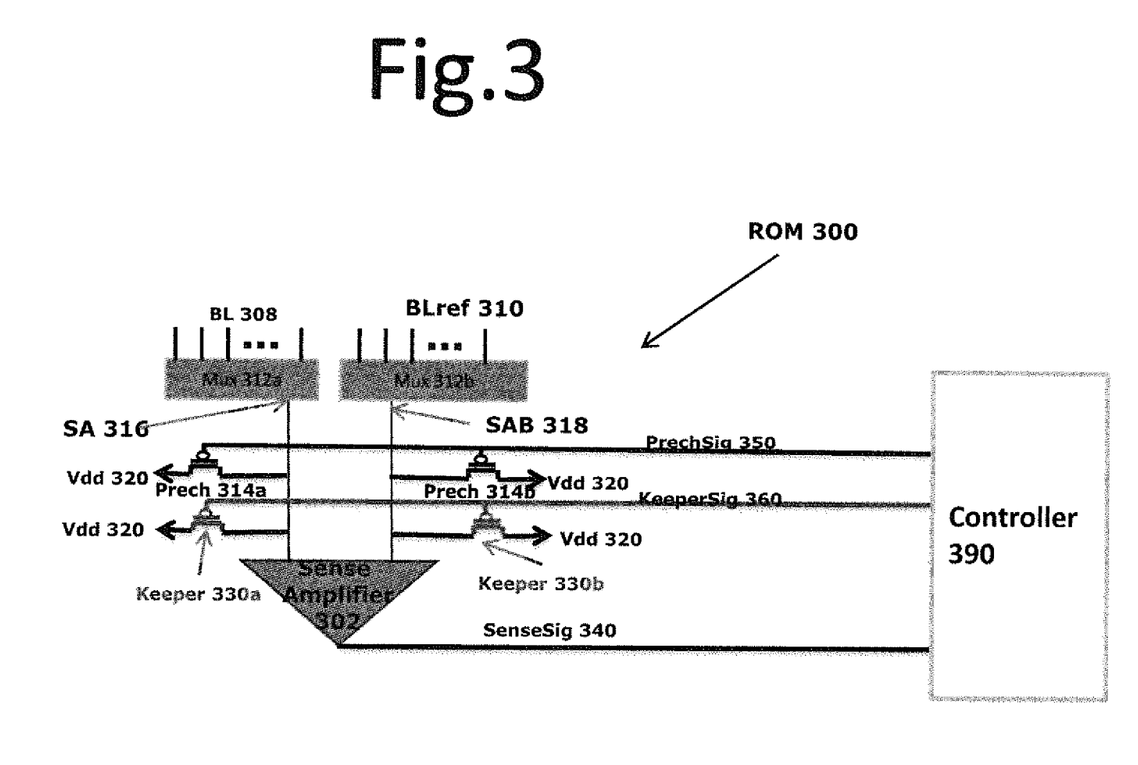
FIG. 3 is an electrical schematic illustrating the architecture of a first exemplary ROM circuit with keepers connecting to sense terminal and reference sense terminal of the sense amplifier.

FIG. 3 is a circuit diagram of a ROM memory device. ROM circuit 300 includes sense amplifier 302, precharge transistors 314a and 314b, keepers 330a and 330b, multiplexers (MUX) 312a and 312b, bit lines 308 and multiple reference bit lines 310, sense terminals (also referred to herein as "input lines") SA 316 and SAB 318. Alternatively, ROM circuit 300 may also include only a single reference bit line. For the reason of generality, multiple reference bit lines 310 are applied.

Each of bit lines 308 is electrically connected to one or a plurality of memory cells (not shown in FIG. 3) of ROM circuit 300. MUX 312a includes one or more pMOS transistors as switches corresponding to bit lines 308 (not individually shown in FIG. 3). Each of these pMOS transistors in MUX 312a, for example, is electrically connected to one of bit lines 308. Similarly, MUX 312b includes one or more pMOS transistors as switches (not shown in FIG. 3). Each pMOS transistor in MUX 312b is electrically connected to one of reference bit lines 310. Sense amplifier 302 includes a sense terminal SA 316, and an optional sense terminal SAB. Precharge transistors 314a is electrically connected to SA 316 and to $V_{dd}$ 320 (power supply voltage), and precharge transistors 314b is electrically connected to SAB 318 and to $V_{dd}$ 320. Keeper 330a is electrically connected to SA 316, and Keeper 330b is electrically connected to SAB 318.

Precharge transistor 314a functions as a switch for precharging SA 316 to power supply voltage $V_{dd}$ 320. Further, ON/OFF of precharge transistor 314a is controlled by a precharge signal 350 as input to a gate of precharge transistor 314a. Precharge transistor 314a is configured to precharge SA 316 to $V_{dd}$ prior to an operation of reading digital data from the memory cells of ROM circuit 300. Similarly, precharge transistor 314b functions as a switch for precharging SAB 318 to power supply voltage $V_{dd}$ 320. Further, ON/OFF of precharge transistor 314b is controlled by a precharge signal 350 as input to a gate of precharge transistor 314b. Precharge transistor 314b is configured to precharge SAB 318 to $V_{dd}$.

Each pMOS transistor in MUX 312a is electrically connected to one of bit lines 308 in a manner that provides for MUX 312a to select each of bit lines 308 as input to MUX 312a. Particularly, MUX 312a selects one bit line from a plurality of bit lines 308 as input to sense amplifier 302 through SA 316. Similarly, each pMOS transistor in MUX 312b is electrically connected to one of reference bit lines 310 in a manner that provides for MUX 312b to select each of reference bit lines 310 as input to MUX 312b. Particularly, MUX 312b selects one reference bit line from a plurality of reference bit lines 310 as input to sense amplifier 302 through SAB 318.

Controller 390 is shown connected to precharge transistors 314a and 314b, by an electrical line carrying precharge control signal 350. Controller 390 is connected to the gate of precharge transistors 314a and 314b respectively. Although a single connection is shown, dedicated connections may be provided. Likewise, the controller may be connected to sense amplifier 302 by an electrical line carrying sense amplifier enable signal 340.

Keeper transistors 330a and 330b are shown similarly connected to the controller 390. As in the case of precharge transistors 314a and 314b, dedicated lines may be provided. Keeper control signal, or dedicated control signal 360 is carried, typically to the gate of keeper transistors 330a and 330b, by the line connecting controller 390 to the keeper transistors.

Sense amplifier 302 is configured to sense the electrical state (e.g., the voltage state) of sense terminals SA 316 and SAB 318. Sense amplifier 302 is controlled by a sense amplifier enable signal 340.

During operation, keeper transistor 330a functions to maintain the voltage level of the electrical line to which it connected (in this case, the electrical line is sense terminal SA 316), at a desired level. Keeper transistor 330a either provides current or drains current from SA 316 to maintain the desired voltage level in response to a dedicated control signal 360. Likewise keeper transistor 330b functions to maintain a desired voltage level on SAB 318, operating in response to dedicated control signal 360. Again as emphasized above, dedicated control signal 360 is indicated as controlling both keeper transistors simultaneously, however individual dedicated control signals 360 (e.g. 360n, where n designates a specific keeper transistor) can be envisioned which can operate each keeper transistor, or sub-groups of keeper transistors separately.

A dedicated control signal, e.g. dedicated control signal 360, is shown as a signal operating on the gate of a keeper transistor, the dedicated control signal being generated in a controller, e.g. controller 390. Controller 390 may be integrated into or independently from a ROM circuit where the keeper transistor located in, e.g. ROM circuit 300. Also as shown, controller 390 can be configured to generate various control signals, e.g. sense enable signal 340 for controlling sense amplifier 302, prechange control signal 350 for controlling precharge transistors 314a and 314b, and dedicated keeper control signal 360 for controlling keeper transistors 330a and 330b.

The dedicated control signal controls the keeper transistor without depending upon the voltage on the line to supply the control. In this sense, a dedicated control signal operates independently of whether the voltage level on the targeted line is above or below the gate threshold of the keeper transistor, in this case, for example, sense terminal SA 316. In other words, the keeper transistor is on as long as the dedicated control signal instructs ON to it, even in the case that the voltage of the electrical line is lower than the threshold value $V_{th}$ of the keeper transistor.

In this manner, the operation of the keeper transistor can be decoupled from the characteristics of the target line. An inverter is no longer necessary, as the state of the signal is generated as needed in the controller. This has the advantage of reducing space required for the keeper circuits.

Moreover, the dedicated control signal may be synchronized with a sense signal, e.g. sense enable signal 340. The keeper transistor is controlled in such a way that when sense amplifier is on, keeper transistor is turned off. This provides an additional advantage over a feedback-based keeper in that the keeper of the present embodiment, when switched off in advance of sensing, will not resist the voltage drop that occurs during a sense operation, allowing for more efficient sensing. By contrast, the feedback-based keeper will remain on unless and until target line voltage drops below the Vth, of the keeper transistor. Accordingly, the present embodiment allows for keeper design and sense timing to be determined independently, resulting at least in improved memory speed/performance and/or power consumption.

Additionally, the arrangement of FIG. 3 permits greater flexibility in the control of target line voltage. The result is a more stable read window, and a greater degree of voltage control. For example, the decoupled keeper of the present disclosure can maintain voltages on the target line below Vth, which would not otherwise be possible.

More particularly, the dedicated control signal 360 is configured to control keeper transistor 330a (i.e. a target line) to maintain the voltage of SA 316 higher than the voltage threshold of the pMOS transistors of MUX 312a. Similarly, keeper transistor 330b functions as a transistor for maintaining the voltage level of an electrical line (i.e. the target line), to which it connected (in this case, the electrical line is SAB 318), at a desired level. Keeper transistor 330b either provides current or drains current from SAB 318 to maintain the desired voltage level in response to a dedicated control signal 360. More particularly, the dedicated control signal 360 is configured to control keeper transistor 330b to maintain the voltage of SAB 318 higher than the voltage threshold of the pMOS transistors of MUX 312b.

Figure 4:
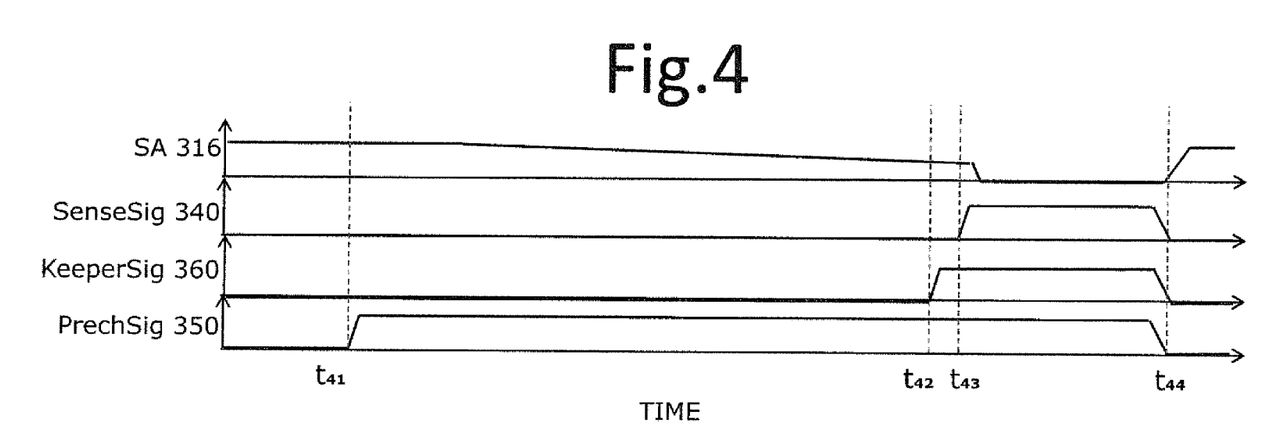
FIG. 4 is a timing diagram showing signals in the ROM circuit according to the disclosure.

Referring to FIG. 4, reading operation of ROM circuit 300 will be described. FIG. 4 is a timing chart showing reading operation of ROM circuit 300 according to the first exemplary embodiment.

First, at time $t_{41}$, precharge signal 350 is switched from Low to High, and a precharge period is terminated. The precharged SA 316 begins discharging rapidly due to leakage. Keeper 330a is controlled to be active by keeper control signal 360. At time $t_{42}$, keeper control signal 360 is switched from low to high, i.e. keeper 330a is inactive. Next, at time $t_{43}$, sense amplifier enable signal 340 is switched from Low to High, and moves to a sense period. Here, sense amplifier 302 is activated, and the potential difference between SA 316 and SAB 318 is amplified. The moment $t_{43}$ when sense amplifier 302 is on, may shortly after the moment $t_{42}$ when keeper 330a is off as illustrated in FIG. 4. Alternatively, the moment $t_{43}$ when sense amplifier 302 is on, can be the same moment as the moment $t_{42}$ when keeper 330a is off to prevent interference of keeper 330a during sensing. Next, at time $t_{44}$, precharge signal 350 is switched from High to Low, so that SA 316 begins to be charged to power supply potential $V_{dd}$. At the same time, keeper signal 360 and sense signal 340 are both switched from High to Low, so that keeper is activated, and the sense period is terminated.

In the first exemplary embodiment, keeper control signal 360 is synchronized with sense signal 340. In other words, when sense amplifier 302 is inactive, keeper 330a keeps in active status; when sense amplifier 302 turns to active, keeper 330a is switched off accordingly. Therefore, the sensing is not interfered by keeper 330a.

Figure 5:
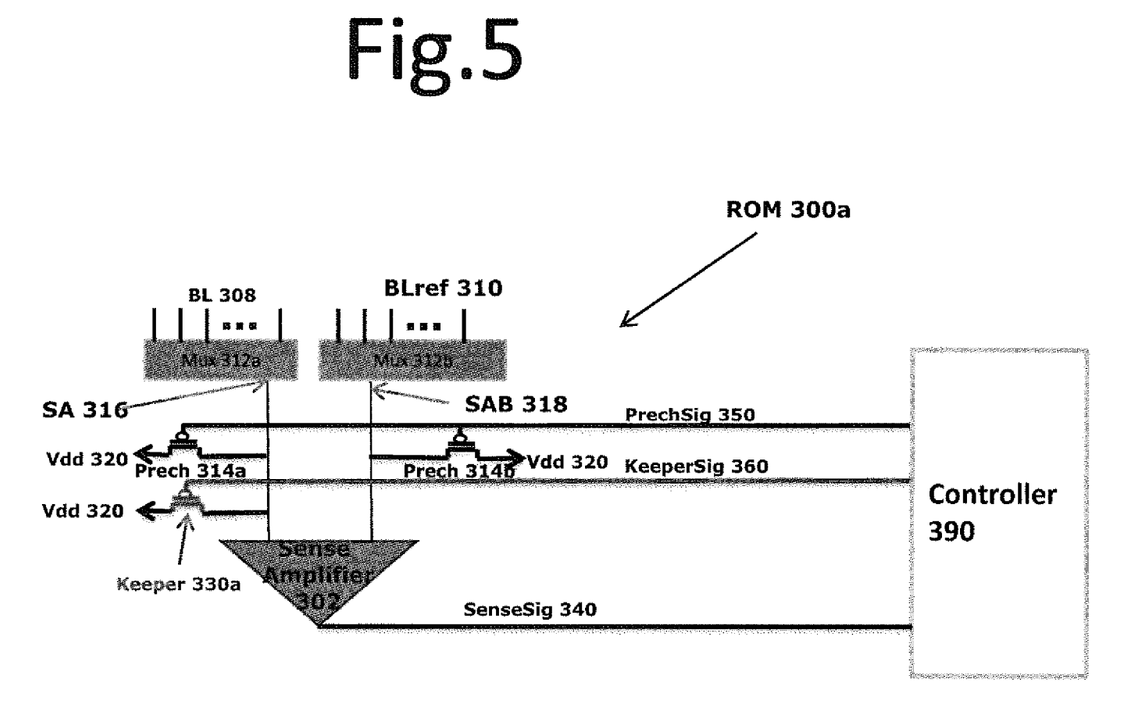
FIG. 5 is an electrical schematic illustrating the architecture of an exemplary ROM circuit.

As shown in FIG. 5, the circuit configuration of ROM circuit 300a is different from that shown in FIG. 3 in that SAB 318 has no keeper connected. More specifically, keeper signal 360 merely controls keeper 330a which connects to SA 316. Therefore, the keeper occupies less space in the ROM circuit.

Figure 6:
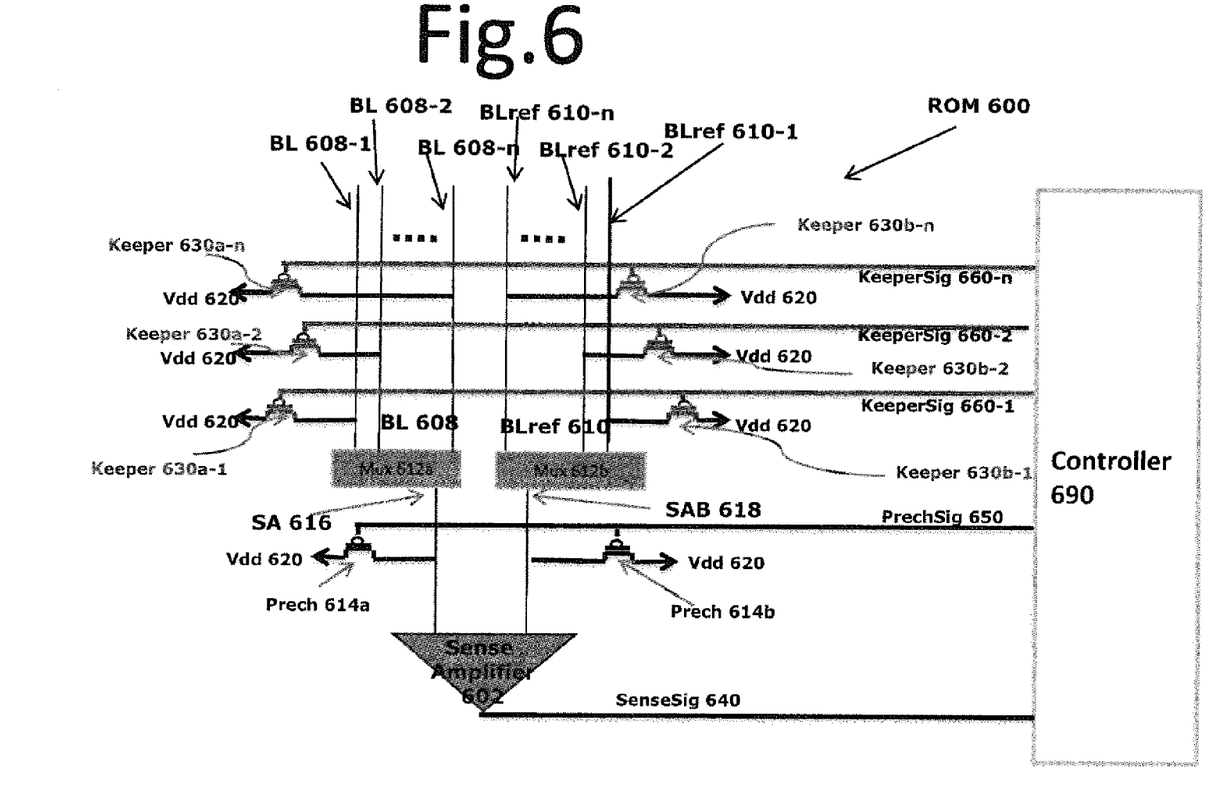
FIG. 6 is an electrical schematic illustrating the architecture of a second exemplary ROM circuit.

FIG. 6 is a simplified circuit diagram of a ROM memory device. ROM circuit 600 includes sense amplifier 602, sense terminals (also referred to herein as "input lines") SA 616 and SAB 618, precharge transistors 614a and 614b, keeper transistors 630a-1 to 630a-n, keeper transistors 630b-1 to 630b-n, multiplexers (MUX) 612a and 612b, bit lines 608 including bit lines 608-1 to 608-n, and reference bit lines 610 including multiple reference bit lines 610-1 to 610-n. Alternatively, reference bit line 610 can also be a single reference bit line. For the reason of generality, reference bit lines 610 including multiple reference bit lines are applied.

Each of bit lines 608 is electrically connected to one or a plurality of memory cells (not shown in FIG. 6) of ROM circuit 600. MUX 612a includes one or more pMOS transistors as switches corresponding to bit lines 608 (not individually shown in FIG. 6). Each of these pMOS transistors in MUX 612a, for example, is electrically connected to one of bit lines 608. Similarly, MUX 612b includes one or more pMOS transistors as switches (not shown in FIG. 6). Each pMOS transistor in MUX mux 612b is electrically connected to one of reference bit lines 610. Sense amplifier 602 includes sense terminal SA 616, and an optional sense terminal SAB 618. Precharge transistor 614a is electrically connected to sense terminal SA 616 and to $V_{dd}$ 620 (power supply voltage), and precharge transistor 614b is electrically connected to sense terminal SAB 618 and to $V_{dd}$ 620. Keepers 630a-1 to 630a-n are electrically connected to each of bit lines 608, and keepers 630b-1 to 630b-n n are electrically connected to each of reference bit lines 610.

Precharge transistor 614a functions as a switch for precharging SA 616 to power supply voltage $V_{dd}$ 620. Further, ON/OFF of precharge transistor 614a is controlled by a precharge signal 650 as input to a gate of precharge transistor 614a.

Precharge transistor 614a is configured to precharge SA 616 to $V_{dd}$ prior to an operation of reading digital data from the memory cells of ROM circuit 600. Similarly, precharge transistor 614b functions as a switch for precharging SAB 618 to power supply voltage $V_{dd}$ 620. Further, ON/OFF of precharge transistor 614b is controlled by a precharge signal 650 as input to a gate of precharge transistor 614b. Precharge transistors 614b is configured to precharge reference SAB 618 to $V_{dd}$ prior to an operation of reading digital data from the memory cells of ROM circuit 600.

Each pMOS transistor in MUX 612a is electrically connected to one of bit lines 608 in a manner that provides for MUX 612a to select each of bit lines 608 as input to MUX 612a. Particularly, MUX 612a selects one bit line from a plurality of bit lines 608 as input to sense amplifier 602 through SA 616. Similarly, each pMOS transistor in MUX mux 612b is electrically connected to one of reference bit lines 608 in a manner that provides for MUX 612b to select each of reference bit lines 610 as input to MUX 612b. Particularly, MUX 612b selects one reference bit line from a plurality of reference bit lines 610 as input to sense amplifier 602 through SAB 618.

Controller 690 is shown connected to precharge transistors 614a and 614b, by an electrical line carrying precharge control signal 650. In a typical embodiment, controller 690 is connected to the gate of precharge transistors 614a and 614b respectively. Although a single connection is shown, dedicated connections may be provided. Likewise, the controller may be connected to sense amplifier 602 by an electrical line carrying sense amplifier enable signal 640.

Keeper transistors 630a-1 to 630a-n and 630b-1 to 630b-n are shown similarly connected to the controller 690. As in the case of precharge transistors 614a and 614b, dedicated lines may be provided. Keeper control signals, or dedicated control signals 660-1 to 660-n are carried, typically to the gate of keeper transistors 630a-1 to 630a-n and 630b-1 to 630b-n, by the lines connecting controller 690 to the keeper transistors.

Sense amplifier 602 is configured to sense the electrical state (e.g., the voltage state) of sense terminals SA 616 and SAB 618.

The circuit configuration of the ROM device 600 shown in FIG. 6 is different from that shown in FIG. 3 in that each keeper is connected to one of bit lines 608 or reference bit lines 610, instead of connected to SA 616 or SAB 618.

More specifically, n bit lines 608-1 to 608-n are connected to MUX 612a. N keeper transistors 630a-1 to 630a-n are connected to each of n bit lines 608-1 to 608-n, as shown in FIG. 6. Each keeper transistor of 630a-1 to 630a-n functions to maintain the voltage level of one of bit lines 608, to which it connects, at a desired level. Keeper transistors 630a-1 to 630a-n either provide current or drain current from their associated bit lines 608-1 to 608-n to maintain the desired voltage level in response to dedicated control signals 660-1 to 660n. Likewise Each keeper transistor of 630a-1 to 630a-n functions to maintain the voltage level of one of reference bit lines 610, to which it connects, at a desired level, operating in response to dedicated control signals 660-1 to 660n. Again as emphasized above, dedicated control signals 660-1 to 660n are indicated as controlling both keeper transistors connecting to bit lines and reference bit lines simultaneously, however embodiments in which individual dedicated control signals 660a-1 to 660a-n and 660b-1 to 660b-n (e.g. 660a-1, where a designates keeper connecting to a bit line, and 660b-1, where b designates keeper connecting to a reference bit line) can be envisioned which can operate each keeper transistor, or sub-groups of keeper transistors separately.

The dedicated control signals can be generated in a controller, e.g. controller 690. Controller 690 may be integrated into or independently from a ROM circuit where the keeper transistors located in, e.g. ROM circuit 600. Controller 690 is configured to generate various control signals, e.g. sense enable signal 640 for controlling sense amplifier 602, prechange control signal 650 for controlling precharge transistors 614a and 614b, and dedicated keeper control signals 660-1 to 660n for controlling keeper transistors 630a-1 to 630a-n and 630b-1 to 630b-n. The dedicated control signals control the keeper transistors to be on/off independently from the voltage level of an electrical line which the keeper transistors connect to, e.g. bit lines 608-1 to 608-n. In other words, the keeper transistor is on as long as the dedicated control signal instructs ON to it, even in the case that the voltage of the electrical line is lower than the threshold value $V_{th}$ of the keeper transistor.

In this manner, the operation of the keeper transistors can be decoupled from the characteristics of the target line. An inverter is no longer necessary, as the state of the signal is generated as needed in the controller. This has the advantage of reducing space required for the keeper circuits.

Moreover, the dedicated control signals are synchronized with a sense signal, e.g. sense enable signal 640. The keeper transistor is controlled in such a way that when sense amplifier is on, keeper transistor is turned off, and when sense amplifier is off, keeper transistor is on again.

Particularly, each of the dedicated control signals 660-1 to 660-n is configured to control associated keeper transistor of 630a-1 to 630a-n to maintain the voltage of each bit line (i.e. a target line), to which it connects, higher than the voltage threshold of the pMOS transistors of MUX 612a.

For example, keeper transistor 630a-1 electrically connects to bit line 608-1, and listens to dedicated keeper control signal 660-1 to provide current or drain current from bit line 608-1, so as to keep the voltage of bit line 608-1 at a desired level. More particularly, the dedicated control signal 660-1 is configured to control keeper transistor 630a-1 to maintain the voltage of bit line 608-1 higher than the voltage threshold of the pMOS transistors of MUX 612a.

Similarly, n reference bit lines 610-1 to 610-n are connected to MUX 612b. N keeper transistors 630b-1 to 630b-n are connected to each of n reference bit lines 610-1 to 610-n, as shown in FIG. 6. Each keeper transistor of 630b-1 to 630b-n functions as a transistor for maintaining the voltage level of one of reference bit lines 610, to which it connects, at a desired level. Keeper transistors 630b-1 to 630b-n either provide current or drain current from their associated reference bit lines 610-1 to 610-n to maintain the desired voltage level in response to dedicated control signals 660-1 to 660n. Particularly, each of the dedicated control signals 660-1 to 660-n is configured to control associated keeper transistor of 630b-1 to 630b-n to maintain the voltage of each reference bit line, to which it connects, higher than the voltage threshold of the pMOS transistors of MUX 612b.

Typically, during read operation, bit lines 608 are kept at higher voltage by the keeper transistors 630a-1 to 630a-n, compared to a conventional ROM circuit without a keeper.

Figure 7:
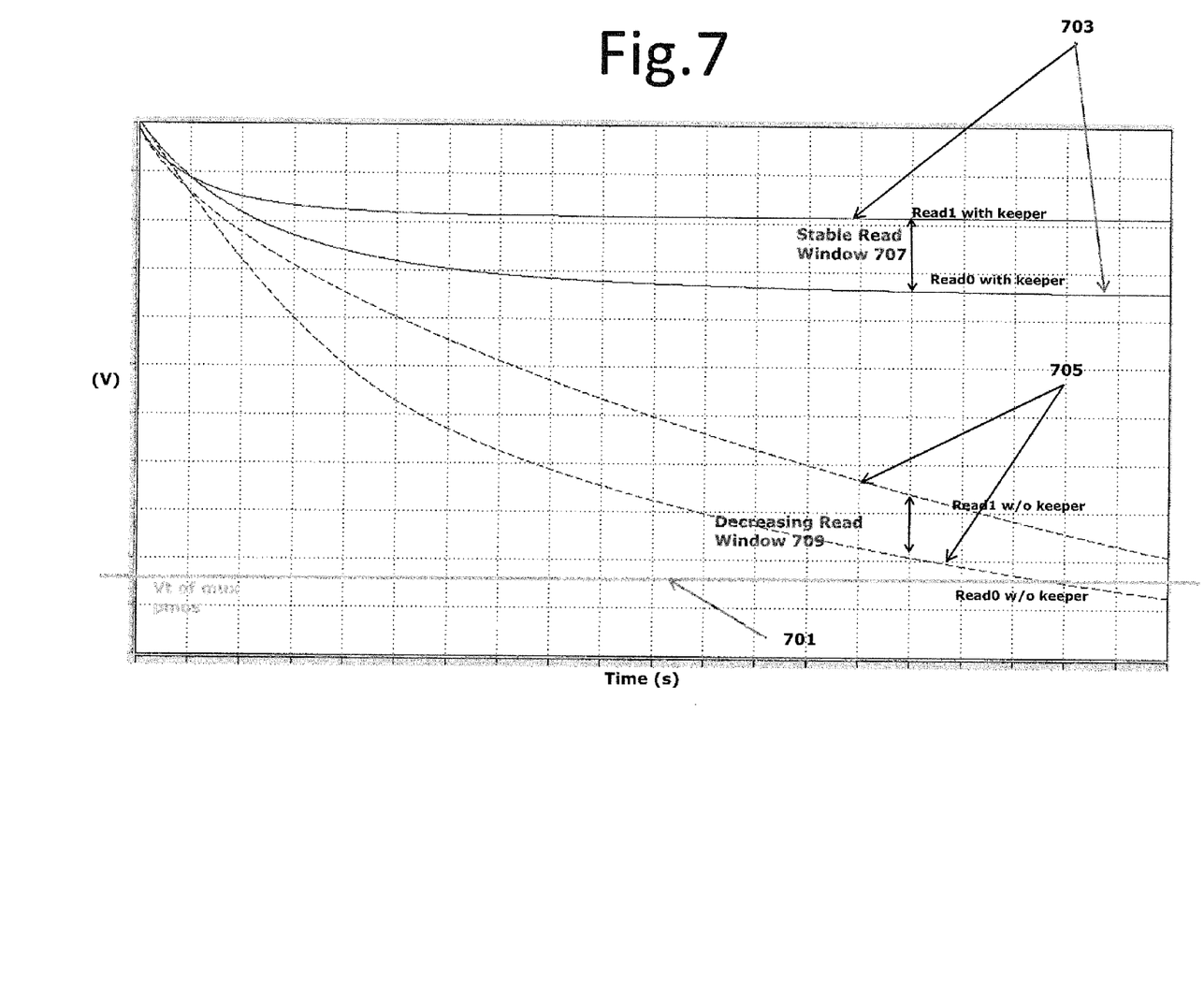
FIG. 7 is a time diagram showing the voltages prior to sensing.

FIG. 7 illustrates a simulation result, for a conventional ROM circuit without any keeper and a ROM circuit such as Rom circuit 600. FIG. 7 illustrates the voltage over time during read 1 and read 0 operations. In FIG. 7, the horizontal bold straight line 701 stands for the voltage threshold of pMOS in MUX 612a, the solid curve lines 703 are voltage levels of bit lines such as 608 in the second embodiment, and the dashed curve lines 705 are voltage levels of bit lines of a conventional ROM circuit without keeper connected. As shown in FIG. 7, the voltage levels of the bit lines 608, which connect to keepers 630a-1 to 630a-n, are kept stable after a short time. In other words, as the values on the bit lines reach their intended levels over time due, for example, to leakage, they are maintained at that level indefinitely by the keeper of the present disclosure. The sensing windows 707 are maintained constantly, sense tuning, therefore, merely depends on the voltage of the bit lines, which do not vary over time. By contrast, the keeperless configuration involves sense-time dependent tuning, which limits design flexibility and memory performance.

Further, due to the implementation of keepers, bit lines 608 merely have to be discharged to a higher level voltage, compared to bit lines in a conventional ROM circuit without keeper, as shown in FIG. 7. The discharged high level voltage is much higher than the threshold value of the pMOS voltage, and therefore, does not limit the signal developed on sense terminal SA 616. Furthermore, the keeper in the current disclosure contains merely one simply transistor, instead of a transistor and an inverter as in a conventional feedback keeper. Therefore, area is saved due to the fact that the keeper in the current disclosure is much smaller than a conventional feedback keeper.

Figure 8:
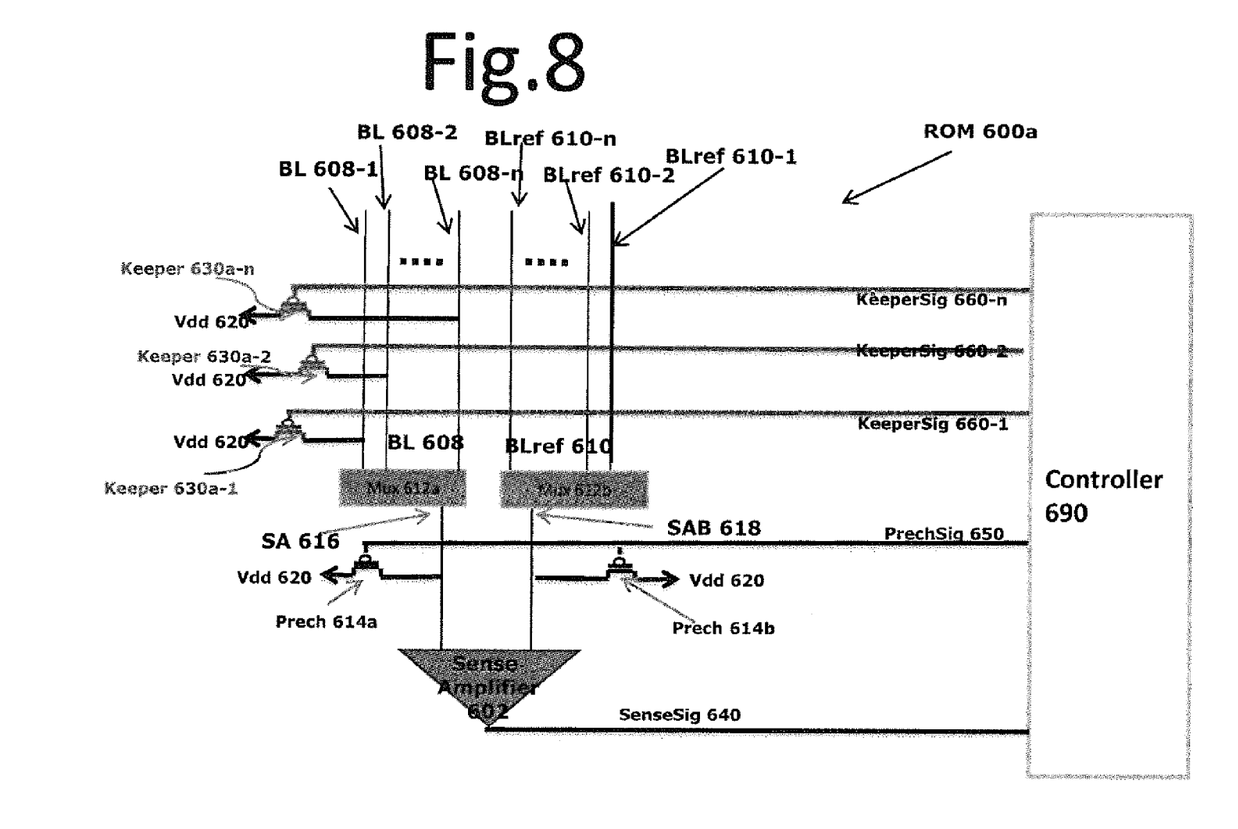
FIG. 8 is an electrical schematic illustrating the architecture of an exemplary ROM circuit.

A variation is shown in FIG. 8. The circuit configuration of ROM circuit 600a shown in FIG. 8 is different from that shown in FIG. 6 in that reference bit lines 610 have no keeper connecting to it. More specifically, keeper signals 660-1 to 660-n merely control keeper 630a-1 to 630a-n which connect to bit lines 608.

Figure 9:
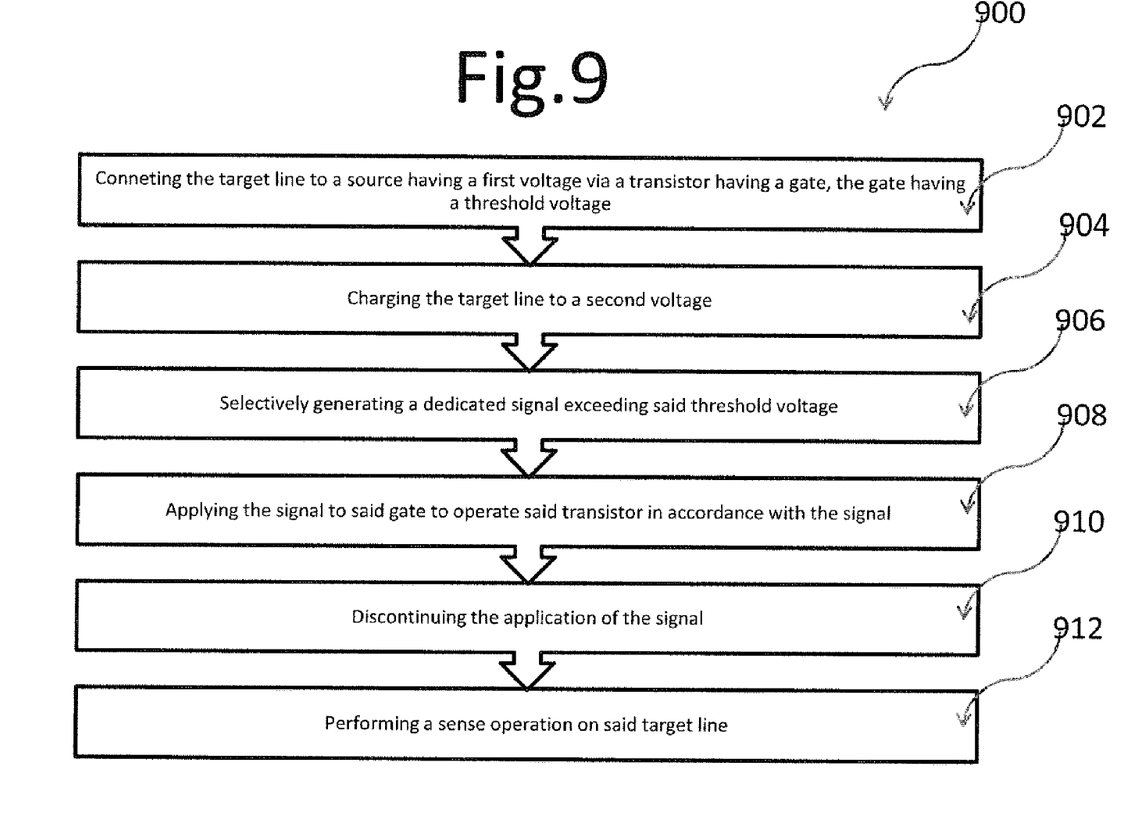
FIG. 9 is a flow chart showing a method of stabilizing current on a target line of a ROM circuit.

A method is provided for stabilizing current on a target line (e.g. a sense amplifier input line or a bit line, etc.). In this regards, the method may be understood by referring to FIG. 9. In FIG. 9, a flow chart portrays various aspects of a method 900. In a step 902, the target line is connected to a source having a first voltage via a transistor having a gate (e.g. a keeper is connected to the sense amplifier input line or the bit line), the gate having a threshold voltage (e.g. the threshold value of the keeper transistor). In a step 904, the target line is charged to a second voltage (e.g. the sense amplifier input line is precharged to $V_{dd}$). In a step 906, a dedicated signal exceeding said threshold voltage is selectively generated (e.g. a generator generates a dedicated control signal for the keeper transistor). In a step 908, the signal is applied to said gate to operate said transistor in accordance with the signal (e.g. the keeper is on, controlled by the dedicated control signal). In a further step 910, the application of the signal is discontinued (e.g. the keeper is off). In a further step 912, a sense operation is performed on said target line (e.g. a sense amplifier begins sensing).

While the disclosure has been particularly shown and described with reference to specific approaches, it should be understood by those skilled in the art that various changes in form and detail may be made therein without departing from the spirit and scope of the present disclosure as defined by the appended claims. The scope of the disclosure is thus indicated by the appended claims and all changes which come within the meaning and range of equivalency of the claims are therefore intended to be embraced.

What is claimed is:

1. A semiconductor memory circuit comprising:
   at least one electrical line; and
   at least one keeper circuit electrically connected to the at least one electrical line, the keeper circuit including a first transistor, a terminal of the first transistor is driven by a dedicated control signal, wherein the dedicated control signal is configured to keep the voltage of the at least one electrical line at a first voltage.

2. The semiconductor memory circuit of claim 1, wherein the terminal of the first transistor is a gate of the first transistor.

3. The semiconductor memory circuit of claim 2, further comprising:
a sense amplifier having at least one input line.

4. The semiconductor memory circuit of claim 3, wherein the dedicated control signal is further configured to control the first transistor to be active until the sense amplifier performs a sense operation.

5. The semiconductor memory circuit of claim 3, wherein the at least one electrical line is configured as the at least one input line.

6. The semiconductor memory circuit of claim 5, further comprising:
a controller, the controller configured to generate the control signal based on the timing of said sense operation.

7. The semiconductor memory circuit of claim 2, further comprising:
at least one multiplexer configured to select at least one of a plurality of bit lines as an input to the at least one multiplexer, at least one of the bit lines being said at least one electrical line.

8. The semiconductor memory circuit of claim 7, wherein said multiplexer includes a plurality of pMOS transistors, said pMOS transistors having a voltage threshold, the first voltage being higher than the voltage threshold of the pMOS transistors.

9. The semiconductor memory circuit of claim 2, wherein the first transistor has a voltage threshold, the first voltage being less than the voltage threshold of the first transistor.

10. The semiconductor memory circuit of claim 2, wherein the keeper circuit does not include an inverter connected to said electrical line.

11. The semiconductor memory circuit of claim 10, further comprising:
a sense amplifier having at least one input line coupled to an output node of the at least one multiplexer.

12. The semiconductor memory circuit of claim 11, further comprising:
at least one precharge transistor coupled to the at least one input line.

13. The semiconductor memory circuit of claim 2, wherein the memory circuit is a Read-Only Memory (ROM).

14. A method for stabilizing voltage on a target line in a memory circuit, comprising:
electrically coupling the target line to a source having a first voltage via a transistor having a gate, the gate having a threshold voltage,
charging the target line to a second voltage,
selectively generating a dedicated signal exceeding the threshold voltage, and applying the signal to the gate to operate the transistor in accordance with the signal, wherein, the voltage on the target line is maintained at the first voltage via a connection of the target line to the source while the signal is applied.

15. The method of claim 14 further comprising
discontinuing the application of the signal; and
performing a sense operation on said target line.

16. The method of claim 15, wherein said signal is generated by a controller, and wherein said controller generates said signal based on a timing of said sense operation.

17. The method of claim 14 wherein said first voltage is below said threshold voltage.

18. The method of claim 14 wherein said target line is electrically coupled to an input of a multiplexer.

19. The method of claim 14 wherein said target line is a bit line in a Read-Only Memory (ROM).

20. The method of claim 14 wherein said target line is electrically coupled to an output of a multiplexer.

21. A semiconductor memory circuit comprising:
at least one electrical line; and
at least one keeper circuit electrically connected to the at least one electrical line, the keeper circuit including a first transistor having a gate, the gate being not electrically connected to the at least one electrical line, and the gate being controlled to keep the voltage of the at least one electrical line at a first voltage.

22. The semiconductor memory circuit of claim 21, wherein the gate of the first transistor has a threshold voltage, and the first voltage is below the threshold voltage.

23. The semiconductor memory circuit of claim 21, further comprising:
a sense amplifier having at least one input line being the at least one electrical line.

24. The semiconductor memory circuit of claim 23, wherein the gate of the first transistor is controlled based on the timing of a sense operation of the sense amplifier.

25. The semiconductor memory circuit of claim 21, further comprising:
at least one multiplexer configured to select at least one of a plurality of bit lines as an input to the at least one multiplexer, at least one of the bit lines being said at least one electrical line.

* * * * *